United States Patent [19]

Dolbear et al.

[11] Patent Number: 5,056,706
[45] Date of Patent: Oct. 15, 1991

[54] LIQUID METAL PASTE FOR THERMAL AND ELECTRICAL CONNECTIONS

[75] Inventors: Thomas P. Dolbear; Colin A. Mackay; Richard D. Nelson, all of Austin, Tex.

[73] Assignee: Microelectronics and Computer Technology Corporation, Austin, Tex.

[21] Appl. No.: 438,563

[22] Filed: Nov. 20, 1989

[51] Int. Cl.⁵ .............................................. B23K 31/02
[52] U.S. Cl. .................................. 228/180.2; 228/248
[58] Field of Search .................... 228/180.2, 248, 121, 228/122; 439/874, 875, 876

[56] References Cited

U.S. PATENT DOCUMENTS

| | | | |
|---|---|---|---|
| 3,141,238 | 7/1964 | Harman, Jr. | 228/248 |
| 4,299,715 | 11/1981 | Whitfield et al. | 252/74 |
| 4,398,975 | 8/1983 | Ohsawa et al. | 148/400 |
| 4,403,410 | 9/1983 | Robinson | 228/180.2 |
| 4,410,457 | 10/1983 | Fujimura et al. | 252/508 |
| 4,435,611 | 3/1984 | Ohsawa et al. | 174/68.5 |
| 4,442,966 | 4/1984 | Jourdain et al. | 228/180.2 |
| 4,448,240 | 5/1984 | Sharon | 165/80 |
| 4,515,304 | 5/1985 | Berger | 228/180.2 |
| 4,604,644 | 8/1986 | Beckham et al. | 228/180.2 |
| 4,732,702 | 3/1988 | Yamazaki et al. | 252/512 |
| 4,740,252 | 4/1988 | Hasegawa et al. | 228/248 |
| 4,769,690 | 9/1988 | Suzuki et al. | 357/67 |
| 4,875,617 | 10/1989 | Citowsky | 228/180.2 |

OTHER PUBLICATIONS

"IBM Technical Disclosure Bulletin", vol. 31, No. 5, Oct. 1988, p. 34.
Keeler, "Liquid Interconnects for Fine Pitch Assembly?", Electronic Packaging & Production, vol. 14, Jun. 1989.
Glushkova et al., "Gallium-Copper and Gallium-Nickel Paste Solders", Svar. Proiz., 1968, No. 11, pp. 36-37.
Tikhomirova et al., "Soldering Copper with Copper-Gallium Solders", Svar. Proiz., 1967, No. 10, pp. 16-18.
Harman, "Hard Gallium Alloys for Use as Low Contact Resistance Electrodes and for Bonding Thermocouples into Samples", The Review of Scientific Instruments, Jul. 1960, vol. 31, No. 7, pp. 717-720.
Tikhomirova et al., "Effect of the Particle Shape and Size of a Second Component on the Properties of Gallium Solders", Poroshkovaya Metallurgiya, Dec. 1969, No. 12 (84), pp. 51-56.

Primary Examiner—Richard K. Seidel
Assistant Examiner—Chuck Y. Mah
Attorney, Agent, or Firm—Fulbright & Jaworski

[57] ABSTRACT

A thermally and electrically conductive paste and its method of use for making a detachable and compliant thermal conductive connection between two surfaces or making an electrical connection between first and second electrical components. The paste is comprised of a liquid metal and particulate solid constituents which is non-solidifying, conformable, compliant, is removable, provides containment to impulsive loading, and is simple to apply.

20 Claims, 3 Drawing Sheets

LIQUID METAL PASTE FOR THERMAL AND ELECTRICAL CONNECTIONS

BACKGROUND OF THE INVENTION

The present invention is directed to a non-solidifying paste consisting of an interspersed mixture of a liquid metal and particulate solid constituents. The present paste is thermally and electrically conductive and can be used for cooling electronics and/or making electrical connections.

The paste has many advantages over liquid metals or solders for use as a thermal interface material. As compared to liquid metals, the present paste is more viscous than liquid metals and provides containment to impulsive loading. In many cases it has higher thermal conductivity and eliminates gross dewetting from certain materials as seen with liquid metals. As compared with solids, the paste is perfectly compliant in the plane parallel to the joined surfaces, resulting in the elimination of thermal stress on the joined surfaces. As with most solid bonds, the paste is compliant in the direction perpendicular to the interface for height variablility tolerant assembly; however, no temperature is required to cure or harden the material, and more importantly the connection is detachable.

The cooling of electronic components in ground based and avionics systems is becoming more challenging. As the desire for greater processing speed and compactness increases, cooling systems for these applications must have an efficient thermal interconnect between the power dissipating element and the final heat sink in the package. This thermal interconnection is the limiting factor in many cooling systems in which heat flows through the back of a chip to a heat exchanger above the substrate. Being a common problem, many techniques have been used. Most can be classified as one of either a solid metallurgical bond, a microstructural or structural contact, a demountable liquid or grease interface, or a combination of these types.

Examples of materials used for a solid metallurgical bond are solders, Au—Si eutectic bonds or silver loaded epoxies. A typical thermal resistance across an interface formed using these materials is approximately 0.2 K-$cm^2$/W depending on the void fraction of the joint and the exact material used. While this thermal performance is very good and acceptable for many applications, this technique is structurally unappealing except for low cost packages with single solid state devices which may be thrown away if a device fails. For multi-chip modules such a solution is almost impossible to engineer and technically unreliable unless special provisions are included in the design to allow rework and repair of the module and to account for the unavoidable positional tolerances between the backside surfaces of the die to be cooled. In addition, these materials require the bond to be formed at an elevated temperature which even further complicates the assembly.

An example of a microstructure interface intended to provide a low impedance thermal interface between solid state device and a cold plate or the like is given in U.S. Pat. No. 4,498,530. This example is similar to many other examples which use a microstructure to increase the area of heat transfer across the interface in an attempt to lower its thermal impedance while providing compliance. While these solutions can achieve the vertical compliance needed from a manufacturing standpoint and the compliance parallel to the surface of the device, their thermal performance is questionable since the complicated structure usually has a long thermal path which offsets the advantage of increasing the apparent area of the interface.

Greases and other grease-like materials have been used for making compliant thermal interconnects. Two examples are Dow Corning Heat Sink Compound DC-340 and the material described in U.S. Pat. No. 4,299,715. These materials have the desirable characteristic of being fluid enough to fill microscopic voids that are present when two macroscopically smooth surfaces are brought into contact. A major object of such materials is to be able to improve the heat conduction across such a joint filling these voids. Despite using materials which have a low conductivity (e.g. 0.01 W/cm K) in comparison to metals, these solutions are attractive because the void area at such an interface is usually greater than 90% of the apparent contact area. The disadvantage of these materials is that they are difficult to handle in production and containing them within the interface, as well as maintaining them in place during operation, is difficult with packages requiring long term reliability.

Liquid metal interfaces retain the desirable characteristics of a thermal grease interface and have a much lower thermal impedance. The thermal conductivity of gallium, for instance, is approximately 100 times greater than that of a thermal grease. Thus, thermal impedances below 0.05 K-$cm^2$/W are achievable. None of the other techniques or materials can approach impedances this low. This is the major attraction of liquid metal based interfaces. However, handling of the material and containment within the interface between the hot chip and the cooling structure is even more critical than with thermal greases. Liquid metals tend to dissolve and/or amalgamate with many of the common metals used to fabricate printed wiring boards and integrated circuits. Thus, incorrectly used, the liquid metal may actually destroy the devices it is being used cool. Moreover, initially wetting as well as wetting of the surfaces to be joined is critical to the thermal performance and containment of a liquid.

Similarly, various methods and materials have been used to make electrical connections between first and second electrical components. Again, the prior art connections did not provide all of the advantages of not only low electrical resistance, but a conformable, compliant and removable connection which is secure enough to withstand the environmental conditions to which the components are subjected.

SUMMARY

One object of the present invention is to provide a thermally and electrically conductive non-solidifying paste, comprised of a mixture of a liquid metal and a particulate solid, which is suitable for reliably and easily making low thermal impedance interfaces in electronic cooling systems and/or usable for making electrical interconnections between electrical components.

Another object of the present invention is the provision of a method of making a detachable and compliant thermally conductive connection between two surfaces by releasably connecting the two surfaces together and/or making a detachable and compliant electrical connection between first and second electrical components by releasably connecting a first electrical component to a second electrical component. In each case, a thermally conductive paste is used comprised of a liquid metal and particulate solid constituents. The proportions of the mixture of liquid and solids is such that the mixture remains a paste for temperatures between the ultimate liquidus and the ultimate solidus lines of the metallurgical phase diagram of the mixture.

Still a further object of the present invention is a paste in which the wetting of the solid constituents by the liquid is enhanced by coating the solid constituents with a material that will wet with the liquid metal such as nickel, silver, or antimony. Another method of enhancing the wetting of the solid constituents by the liquid metal is by alloying a metal, such as nickel, silver, or antimony, to the liquid.

Another object of the present invention is a paste wherein the solid constituents are not fully wetted by the liquid and may be fully or partially encapsulated by a gas, an oxide film, or a mixture of both.

Still a further object of the present invention is a paste wherein the mixture has a viscosity in the range of 20,000 to 200,000 centipoise.

Still a further object is a paste wherein the liquid and the solids do not produce a reaction compound and the solids are soluble in the liquid to some extent.

Yet a further object of the present invention is a paste wherein the liquid and solid constituents produce a reaction compound layer on the solid constituents and the solid constituents are soluble in the liquid to some extent.

Still a further object of the present invention is the provision of a non-solidifying compliant, conformable, and thermally and electrically conductive paste comprised of a liquid metal and particulate solid constituents. The proportions of the mixture of liquid and solids, in the range of temperatures encountered, lies between the ultimate liquidus and the ultimate solidus of the metallurgical phase diagram of the mixture, and a third material is added to the mixture to enhance the wetting of the mixture. The third material may coat the solid constituents and wet with the liquid metal and/or the material may alloy with the liquid metal. Preferably, the mixture has a viscosity in the range of 20,000-200,000 centipoise, the liquids and solids do not produce a reaction compound, and the solids are soluble in the liquid to some extent.

Still a further object of the present invention is wherein the thickness of the paste used for a thermal connection is not less than 1 mil and is no more than approximately 1 to 80 mils.

A still further object of the present invention is wherein the paste can be applied at room temperature.

Yet a further object of the present invention is the ability to control the paste's thermal and electrical conductivities and the paste's viscosity by means of the particle loading and the powder or powders chosen.

A still further object of the present invention is wherein the paste is constrained to remain in the positions required for thermal and electrical connections due to the physical nature of the paste.

Other and further objects, features and advantages will be apparent from the following description of presently preferred embodiments of the invention, given for the purpose of disclosure and taken in conjunction with the accompanying drawings.

DESCRIPTION OF THE PREFERRED EMBODIMENT

While the paste of the present invention and its method of making are directed to a detachable and compliant thermal connection between two surfaces and/or providing a detachable and compliant electrical connection between first and second electrical components, the present invention will be described with specific preferred embodiments set forth for purposes of illustration only.

Figure 1:
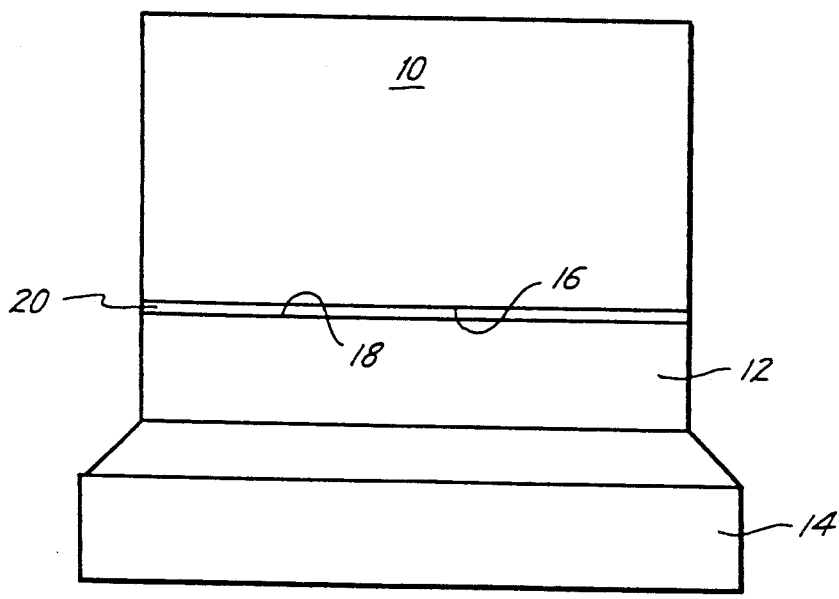
FIG. 1 is a side view of the connection of a heat exchanger to an electrical component.

Referring now to the drawings and particularly to FIG. 1, the reference numeral 10 generally indicates any suitable type of heat exchanger, which is to be attached to an electronic component such as an integrated circuit chip package 12 which, in turn, is supported from a substrate 14. In order to cool the electronic component 12 by the heat exchanger 10, a surface 16 of the heat exchanger 10 is attached or connected to a surface 18 of the component 12. This attachment is by means of surface tension between connection 20 and surfaces 16 and 18. Obviously, the connection 20 should have a low thermal resistance to heat flow. However, in addition to this characteristic, it is advantageous that the connection 20 allow conformity between the surfaces 16 and 18 to insure a good transfer of heat and reliable manufacturability. Another advantageous characteristic is that the connection 20 should be compliant as compliance aids assembly of the interconnection of the surfaces 16 and 18, as well as any other surfaces (not shown) due to the accommodation of the engineering tolerances of their positions relative to each other. Being at or near room temperature and fluid, connection 20 should also alleviate stress problems imposed by differential thermal expansion of the exchanger 10 and component 12 during use, since the thermal expansions will be absorbed in the connection 20 and thereby not transmitted to the other parts forming the joint. Another desirable characteristic is that the connection 20 should be releasable thereby allowing disconnection of the various components and allowing for rework and reconnection.

The present invention is directed to releasably connecting the surface 16 to the surface 18 with a thermally conductive and compliant paste of a liquid metal in a mixture with particulate solid constituents, such as particles or fibers. This paste can be made by mechanically mixing a liquid metal, such as gallium, with a powder, such as aluminum. Examples of suitable liquids and particulate solid constituents (i.e. fillers) will be more fully discussed in the examples given hereafter. The particulate solid constituents can be other metals, non-metals, or combinations thereof. The materials added to the liquid as well as their compositions are selected such that a paste is formed instead of a permanent solid. An advantage of the paste is that it can be produced and then applied at room temperature, for example by screen printing, to join the two surfaces 16 and 18. This method avoids exposing the electronic component 12 and the substrate 14 to an elevated temperature cure that is required when a permanent bond is formed.

Importantly, use of the present paste in the interconnection 20 allows removal of the heat exchanger 10 from the chip package 12 allowing for rework, while providing a low thermal resistance (i.e. less than 0.1 K-cm²/W) across the connection 20.

In addition, the use of the paste as the connection 20 will provide compliance parallel to the surfaces 16 and 18. This will minimize the thermal stress on surfaces 16 and 18. This characteristic will allow thinner interfaces and larger chips to be reliably attached to various surfaces than can be accomplished with solid bonds or other metallurgical bonds while still meeting the same fatigue-life requirements.

Thinner interfaces can be particularly advantageous for single chip packages such as PGA. In addition, for multi-chip chip modules it is estimated that the surfaces 16 and 18 may be held together by the paste of the present invention with a thickness of approximately 1–80 mils, but not less than the maximum particle size. For other applications, however, a thicker interface can be used to provide more tolerant assembly yet still meet the thermal requirements due to the high conductivity of the paste.

Additionally, the paste should have a suitable viscosity, for example from 20,000 to 200,000 centipoise, to reliably maintain the connection 20 formed and which is also suitable for the method of applying the paste to the surfaces 16 and 18.

Figure 2:
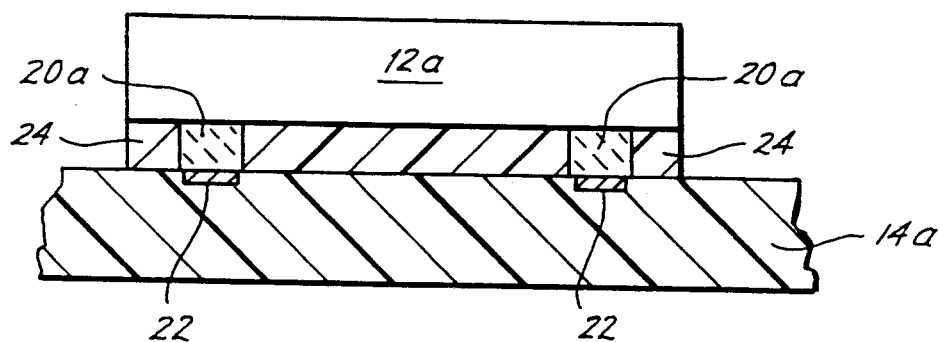
FIG. 2 is a side view illustrating the connection of one electrical component to a second electrical component.

The paste of the present invention has other applications. As best seen in FIG. 2, the paste is used in making electrical connections between first and second electrical components because of its low electrical resistivity.

Referring now to FIG. 2, a chip 12a is shown utilizing the paste interconnection 20a of the present invention to connect a first electronic component 12a to a second electronic component 14a such as a substrate having a plurality of conductors or traces 22. The interconnection 20a again has the advantages of being removable, compliant, thin, but with the desirable amount of strength or viscosity, as well as high electrical conductivity. If desired, an additional method of attachment such as an adhesive film 24 may be provided to additionally secure the component 12a to the substrate 14a, which may be any suitable adhesive such as a generic acrylic or epoxy. The adhesive film 24 also surrounds the paste interconnections 20a and prevents the paste 20a from migrating under acceleration loads.

Figure 3:
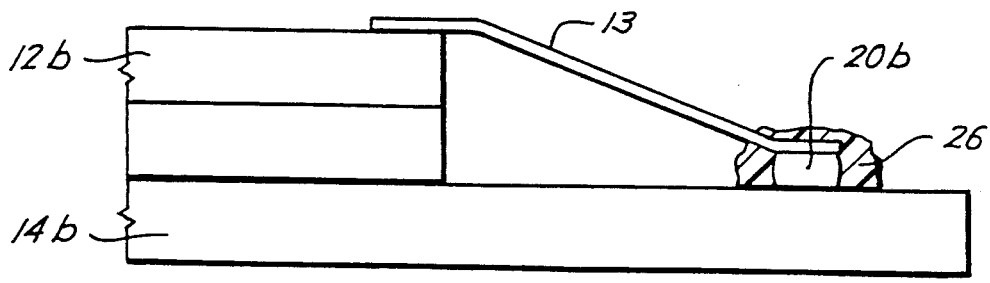
FIG. 3 is another embodiment of a method of making an electrical connection between first and second electrical components.

Referring now to FIG. 3, still a further embodiment of the use of the present invention illustrates another method of making an electrical connection between a first electrical component such as chip 12b and a second electrical component such as substrate 14b. In this embodiment, the paste connection 20b is used for an outer lead bond of a tape-automated-bonding (TAB) lead 13. Again, this connection provides the desirable characteristics of low electrical resistance, a removable bond, a compliant connection for overcoming thermal expansion and mechanical fatigue, and the use of a thin connection for further reducing electrical resistance, but with sufficient strength and surface tension to provide a secure connection. Again, if desired, an adhesive attachment such as an encapsulant 26 may be provided, such as silicon rubber, to additionally support the connection 20b, and prevent its migration, while still providing a connection which has the necessary compliance and is removable.

The non-solidifying liquid metal with a solid particle provides a separable, reliable connection to provide a low thermal resistance as well as a low electrical resistance. The paste-like consistency coupled with metallic properties provides a connection with advantageous thermal conductivity and electrical conductivity comparable to or greater than a liquid metal or solid amalgams but is more easily contained than metal liquids and forms a separable bond unlike solid amalgams.

The advantageous properties and results are illustrated in the following examples:

EXAMPLES

Figure 4:
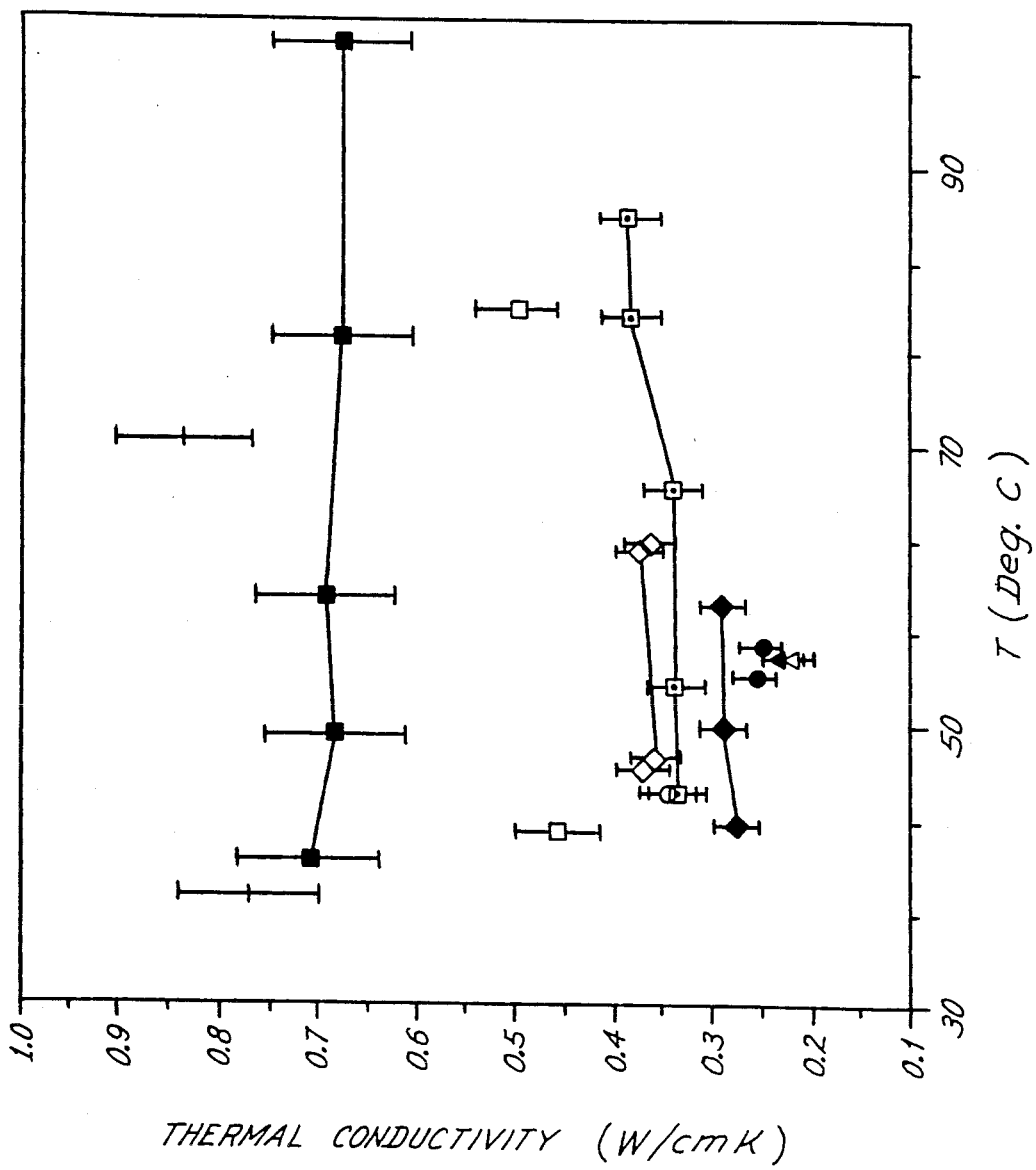
FIG. 4 is a graph of thermal conductivity versus temperature of the results of various tests performed.

Various liquids and pastes were prepared to ensure that the paste could be made and to test the resultant thermal conductivity of the mixture. All the pastes tested were much more viscous than liquid gallium alone. Of the pastes tested only the Ga/Si powder system exhibited difficulty in making the paste. Thermal conductivity measurements were made to determine how the addition of solids affected this property and to determine how to increase the thermal conductivity. The thermal conductivity results are plotted in the graph of FIG. 4. The absolute uncertainty for each measurement is also depicted. This probablistic error is useful when comparing data determined by using different measurement techniques or by different investigators. When comparing the measured results, the uncertainty of repeated trials is the valid uncertainty measure to consider. This ranged from 0.01 W/cm-K to 0.03 W/cm-K.

The tests that were run are as follows:
Liquids:
 1. Ga (99.9999% pure)
 2. Ga—In—Sn (62.5%/21.5%/16% by weight)
 3. Ga/Al solution (98.8%/1.20% by weight)
Pastes:
 4. Ga/Si (approx. 49.3%/50.6% by volume)
 5. Ga/Cu (oxidized powder)
 6. Ga/Al
 7. Ga/Ag
 8. Ga/C (labelled graphite)
 9. Ga/W The compositions of the liquids in Tests 1–3 were determined by X-ray analysis. The paste of Tests 4–9 were constructed in an air environment by mechanically mixing the powder component with the liquid Ga. The exact composition is given for the mixture for the paste in Test 4. In the other tests, 5–9, the mixture included solids in the range of from 40–50% by volume. In all of the tests, 4–9, the size of the solids were less than 45 microns. Further, test 5 will form a permanent solid over time, i.e. an amalgam, so the system in test 5 is less useful for the applications described herein.

A difficulty in mixing known proportions is that a portion of the gallium tends to wet the container in which the paste is mixed. As a result, it cannot easily be removed from the container. Therefore, the approach was to load the gallium with the powder (about 40–50% powder by volume) until the mixture was quite viscous (20,000 to 200,000 centipoise). The viscosity is quite controllable and depends primarily on the particle loading and possibly the particle shape and history.

The liquid metals, tests 1–3, were tested as a control group to compare to the paste results and to indicate the change in thermal conductivity compared to the basis liquid metal. Referring to the graph the paste can be classified in two categories—those which increased the thermal conductivity and those that did not.

Certain compounds did not improve the thermal conductivity. There seems to be three possible causes:
1. Difficulty wetting the particle in the current method of making.
2. The formation of reaction compounds between the liquid and the powder.
3. The powder properties were below their expected value.

A method is not presently known to determine the properties of the powder particles if it is manufactured as a powder.

Test 4, Ga/Si, is an example of a paste that decreased the conductivity due to improper wetting. SEM photos revealed that we actually seemed to encapsulate the particle with a thin layer of air or air and an oxide film. This difficulty in wetting the particles stems from the $SiO_2$ naturally present on the silicon. In addition, a brown compound was also noted to form on the mixing spatula that prohibited the gallium from wetting it. This is assumed to be some oxide which forms in the Ga/Si/0 system. For our purposes at this time, no effort was made to understand this compound further.

Test 8, Ga/C, is another example of either improper wetting or of the use of a low conductivity powder. Graphite has highly anisotropic thermal properties. It also has a high thermal conductivity (22 W/cm-K) parallel to hexagonal planes in the crystal structure and a low conductivity of 0.05 W/cm-K perpendicular to these planes. Amorphous carbon has a conductivity on the order of this lower value. Thus, either this directional dependence or the use of amorphous carbon could result in decrease in the conductivity. A potential method to advantageously use the anisotropy would be to use particles or fibers elongated in a favorable direction to provide preferential conduction parallel or perpendicular to the interface.

Test 5, Ga/Cu, is an example of a paste that caused a formation of reaction compounds between the liquid and the powder and resulted in a solid amalgam layer around each particle. This amalgam has low conductivity compared to Thus, it lowers the effective conductivity of added powder and the mixture.

Test 7, Ga/Ag, is a clear example of the formation of reaction negating possible conductivity improvements.

As indicated by a metallurgical phase diagram, this mixture forms secondary solid phases in the temperature regions of interest.

Figure 5:
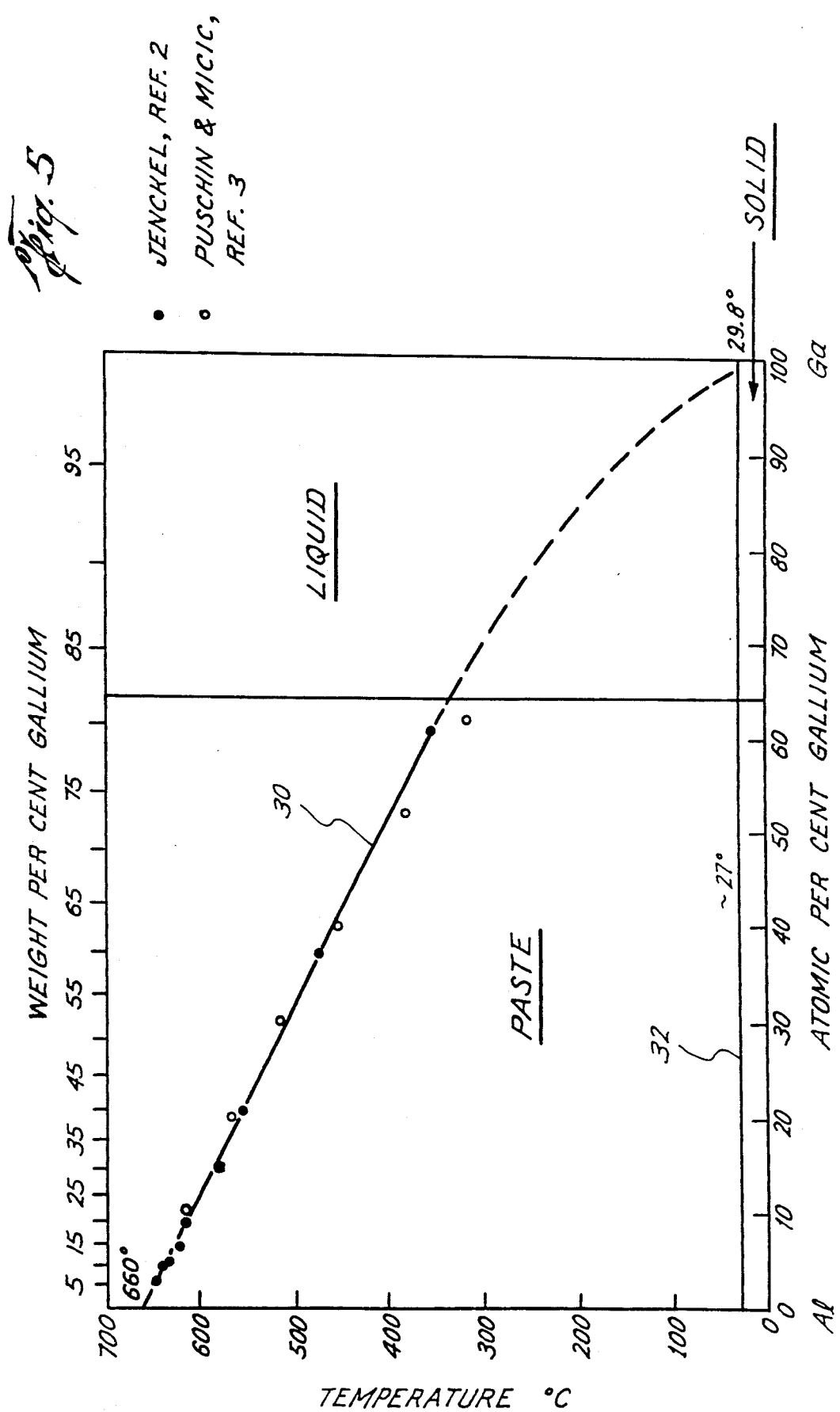
FIG. 5 is a metallurgical phase diagram of the mixture of gallium and aluminum versus temperature.

The two systems which did show a measurable improvement were Ga/Al, test 6, and Ga/W, test 9. The desirable characteristics of these systems are that no reaction compounds are formed and the powder is soluble in the liquid to a certain extent, which enhances wetting. The Ga/Al phase diagram, FIG. 5, shows that Al is soluble on the order of 3 wt. % at temperature range of 20 to 150 degrees celcius. The G/W phase diagram is less well known; however, it is believed that W is soluble in Ga but to a lesser extent than Al.

Both of the powders form oxides on the surfaces; however, the Ga undermines the surface oxides since the dissolution of the element into the melt is more energetically favored than formation of a complex oxide involving Ga. The mechanism for this process is probably via cracks in the oxide layer or the relative thinness of this layer.

While the tests above indicate that several of the compounds such as Ga/Al and Ga/W have superior thermal conductivity, all of the pastes that remain in the paste state, that is, tests 4 and 6–9 are suitable for making a detachable thermal conductive connection or a detachable electrical connection because of their other advantageous features of being removable, conformable, compliant, enhanced containment, and easier to apply. Therefore, it is concluded that a non-solidifying paste could be prepared out of various combinations of a liquid metal and particulate solid constituents such as the following:

| Liquids (Melting Point, degrees C.) | Powders |
| --- | --- |
| Gallium (30) | Aluminum |
| Indium (259) | Aluminum Nitride |
| Gallium/Tin (16) | Antimony |
| Gallium/Indium (15) | Cobalt |
| Gallium/Indium/Tin (5) | Chromium |
| Other Combinations with | Diamond |
| Mercury, Cadium, and | Germanium |
| Bismuth | Gold |
| | Graphite |
| | Iron |
| | Magnesium |
| | Manganese |
| | Molybdenum |
| | Platinum |
| | Silicon Carbide |
| | Silver |
| | Tungsten |
| | Vanadium |

In determining what is the proper proportion of the mixture of liquids and solids, this determination is made from the metallurgical phase diagram of the mixture, in the range of temperatures to be encountered in the environment of the connection. The proportions of the mixture must lie between the ultimate liquidus and the ultimate solidus of the metallurgical phase diagram of the mixture. That is, referring now to FIG. 5 in the example of the mixture of Al—Ga, the line 30 separates the liquid phase from the paste phase and the line 32 separates the paste phase from the solid phase. Therefore, any of the mixtures of Al and Ga between the lines 30 and 32 at the temperatures involved will remain a paste and be suitable for the applications herein discussed.

Another suitable definition of a conductive paste is one in which a solid is combined with a liquid to create a two phase mixture in which the constituents remain as a liquid and a solid over the range of temperatures encountered in which the range is a function of the specific composition of the constituents.

As discussed in connection with certain of the tests, there was difficulty in wetting the solid particles with the liquid metal. Test4, Ga/Si, is an example of a difficult mixture to wet. This wetting may be improved by coating the solid constituents with a material that will wet with the liquid metal. For example, coating Si particles or powders with Ni will enable the particles to be better wetted. Other suitable coating materials include silver and antimony.

Another way of enhancing the wetting of the solid constituents by the liquid metal is by deliberately alloying a material to the liquid metal. For example, low levels of Ni alloyed to Ga will greatly enhance direct wetting to $Al_2O_3$ and Si. Other suitable alloying materials include silver and antimony.

Still a further way of creating a liquid metal paste in which the particles or fibers of the solid constituents are not wetted by the liquid metal is to encapsulate the particles or fibers by the liquid metal present trapping a gas pocket, or instance of air, around each particle or fiber, which acts as an emulsifant to create the liquid metal paste.

It was also noted from the tests that a more satisfactory paste is formed in which the liquids and solids do not produce a reaction compound. The most satisfactory material is one in which the solids are soluble in the liquid to some extent without a reaction compound.

Additionally, if desired, the paste can contain a solid constituent, such as particles or fibers, which are oriented parallel to the plane of an electronic component in contact with the paste in order to enhance the thermal spreading capability of the paste. Suitable fibers include graphite, tungsten, or silicon. Woven meshes of fibers can also be used.

The present invention, therefore, is well adapted to carry out the objects and attain the ends and advantages mentioned as well as others inherent therein. While presently preferred embodiments of the invention have been given for the purpose of disclosure, numerous changes in the detail of construction, arrangement of parts, steps of the process and composition of the paste, will be readily apparent to those skilled in the art and which are encompassed within the spirit of the invention and the scope of the appended claims.

What is claimed is:

1. A method of making a detachable and compliant thermally conductive connection between two surfaces comprising, releasably connecting the two surfaces together with a thermally conductive non-solidifying paste comprised of a liquid metal and particulate solid constituents, wherein the proportions of the mixture of liquid and solids, in the range of operational temperatures encountered, lies between the ultimate liquidus and the ultimate solidus of the metallurgical phase diagram of the mixture.

2. The method of claim 1 wherein the solid constituents are coated with a material that will wet with the liquid metal.

3. The method of claim 2 wherein the material is selected from the group consisting of nickel, silver and antimony.

4. The method of claim 1 enhancing the wetting of the solid constituents by the liquid metal by alloying a material to the liquid.

5. The method of claim 4 wherein the material is selected from the group consisting of nickel, silver and antimony.

6. The method of claim 1 wherein the solid constituents are encapsulated by a gas entrapped around each particle during the mixing with the liquid to create the paste.

7. The method of claim 1 wherein the mixture has a viscosity in the range of 20,000 to 200,000 centipoise.

8. The method of claim 1 wherein the liquid and the solids do not produce a reaction compound and the solids are soluble in the liquid to some extent.

9. The method of claim 1 wherein the thickness of the paste connection is approximately 1-80 mils.

10. The method of claim 1 wherein the solids are wet with the liquid but do not form reaction compounds therewith.

11. The method of claim 1 wherein the solids are wet with the liquid but do not dissolve therein.

12. The method of claim 1 wherein the solids are elongate and have a longitudinal axis oriented parallel to the plane of an electronic component in contact with the paste in order to enhance the thermal spreading capability of the paste.

13. A method of making a detachable and compliant electrical connection between first and second electrical components comprising, releasably connecting a first electrical component to a second electrical component with an electrically conductive non-solidifying paste comprised of a liquid metal and solid particulate constituents, wherein the proportions of the mixture of liquid and solids, in the range of operational temperatures used, lies between the ultimate liquidus and the ultimate solidus of the metallurgical diagram of the mixture.

14. The method of claim 13 wherein the mixture has a viscosity in the range of 20,000 to 200,000 centipoise.

15. The method of claim 13 wherein the liquid and the solids do not produce a reaction compound and the solids are soluble in the liquid.

16. The method of claim 13 wherein the liquid and solid react to form a compound layer on the solid particulate constituents.

17. The method of claim 16 wherein the solid particulate constituents are at least partially soluble in the liquid.

18. The method of claim 13 wherein the solids are wet with the liquid but do not form reaction compounds therewith.

19. The method of claim 13 wherein the solids are wet with the liquid but do not dissolve therein.

20. The method of claim 13 wherein the solids are elongate and have a longitudinal axis oriented parallel to the plane of an electronic component in contact with the paste in order to enhance the thermal spreading capability of the paste.

* * * * *

UNITED STATES PATENT AND TRADEMARK OFFICE
CERTIFICATE OF CORRECTION

PATENT NO. : 5,056,706
DATED : October 15, 1991
INVENTOR(S) : Thomas P. Dolbear, et al It is certified that error appears in the above-identified patent and that said Letters Patent is hereby corrected as shown below:

Column 2, line 39, after "used" insert -- to --

Column 2, line 40, after "as" insert -- maintaining --

Column 5, line 20, delete the second occurrence of "chip"

Column 7, line 44, after "to" insert -- copper. --

Column 7, line 47, after "reaction" insert -- compounds --

Column 7, line 59, delete "G/W" and insert therefor --Ga/W --

Column 7, line 61, delete "soluble" and insert therefor-- soluble --

Column 10, line 9, after "liquid" delete "to some extent"

Signed and Sealed this

Fifth Day of October, 1993

Attest:

BRUCE LEHMAN

Attesting Officer

Commissioner of Patents and Trademarks